United States Patent [19]
Galdos et al.

[11] Patent Number: 5,655,277
[45] Date of Patent: Aug. 12, 1997

[54] VACUUM APPARATUS FOR THE SURFACE TREATMENT OF WORKPIECES

[75] Inventors: Aitor Galdos, Vaduz, Liechtenstein; Rudolf Wagner, Weite; Markus Bruderer, Widnau, both of Switzerland

[73] Assignee: Balzers Aktiengesellschaft, Furstentum, Liechtenstein

[21] Appl. No.: 693,987

[22] Filed: Aug. 8, 1996

[30]     Foreign Application Priority Data

Oct. 17, 1995 [CH] Switzerland ............... 02937/95

[51] Int. Cl.⁶ .................. B23Q 7/14; B65G 1/06
[52] U.S. Cl. ............... 29/33 P; 29/25.01; 204/298.25; 414/217; 414/939
[58] Field of Search ............... 29/33 P, 25.01, 29/25.02, 563; 204/192.1, 298.25, 298.28; 414/217, 937, 939, 940, 941

[56]           References Cited

U.S. PATENT DOCUMENTS

| | | | |
|---|---|---|---|
| 4,663,009 | 5/1987 | Bloomquist et al. | 204/298.25 |
| 4,675,096 | 6/1987 | Tateishi et al. | 204/298.25 |
| 5,135,608 | 8/1992 | Okutani | 414/217 X |
| 5,292,393 | 3/1994 | Maydan et al. | 414/217 X |
| 5,439,547 | 8/1995 | Kumagai | 414/940 X |

FOREIGN PATENT DOCUMENTS

| | | | |
|---|---|---|---|
| 96270 | 6/1984 | Japan | 29/33 P |
| 207866 | 9/1987 | Japan | 204/298.25 |
| 2288139 | 11/1990 | Japan | 29/33 P |

*Primary Examiner*—William R. Briggs
*Attorney, Agent, or Firm*—Notaro & Michalos P.C.

[57]              ABSTRACT

Vacuum processing plant with a small footprint for the surface treatment of large-area substrates in a virtually upright position, has a vacuum chamber containing a substrate carrier rotatable about a central axis and with at least one processing station mounted on its periphery. A transfer chamber is also mounted on its periphery and connects it to a load-lock chamber. A first transport mechanism moves the substrates from the transfer chamber in a radial direction in and out of the vacuum chamber, a second transport mechanism moves the substrates in a direction perpendicular to that of the first transport mechanism, between the transfer chamber and the load-lock chamber. A third transport mechanism moving in parallel with the second one doubles the transport capacity between the load-lock chamber and the transfer chamber.

9 Claims, 1 Drawing Sheet

VACUUM APPARATUS FOR THE SURFACE TREATMENT OF WORKPIECES

FIELD AND BACKGROUND OF THE INVENTION

The present invention relates to a vacuum apparatus for treating workpieces in accordance with the generic term of claim 1.

Vacuum apparatuses for coating workpieces are known that feature a vertically arranged, cylindrical or polygonous vacuum chamber with process stations such as sputtering sources, etching devices or also heating devices arranged on the outer surfaces of said chamber, and with a cylindrical, rotative workpiece holder arranged around the central axis of said chamber, so that the workpieces can be incrementally or continually transferred across the various process stations. Such systems are frequently operated in so-called "batch mode" which means that several workpieces are placed simultaneously on the substrate holders and loaded through a vacuum lock into the system for subsequent processing.

Also known are systems with a cylindrical arrangement, such as described in U.S. Pat. No. 4,675,096 in which the workpieces are loaded and unloaded individually through the vacuum lock and processed in consecutive cycles. The system described in said patent is principally suited to small-surface workpieces. Large-surface workpieces which often are very thin and consequently delicate to handle, cannot readily be processed with such a system configuration. With the high process cycle frequencies required for economical operation, it is particularly difficult to find a configuration through which large-surface substrates can be reliably processed without breaking them.

For large-surface workpieces to be coated, systems have become known that are typically operated as so-called linear flowthrough or cyclic systems. In this type of system the process stations are arranged consecutively in a line and the workpieces are usually loaded through the vacuum lock at one face side and unloaded on the opposite side. Such a system is described, for example, in U.S. Pat. No. 4,663,009. For increasing the cycle frequency, two load locks are arranged at the input to the linear arrangement.

The disadvantage of "batch systems" is that no continuous operation is feasible. Due to their design concept linear systems require a large amount of space. In addition these systems cannot be easily integrated in a production operation because the loading and unloading stations are far apart. Such systems normally require a so-called substrate carrier that travels through the entire system. This means that a higher amount of particles may possibly be generated due to the long transport path and the complex mechanical system. In addition long, space consuming return systems for the large-surface workpiece holders are needed. An additional disadvantage is that the loading and unloading cycle is coupled directly to the system cycle.

SUMMARY OF THE INVENTION

The aim of the present invention is to remedy the disadvantages of the existing technology. In particular a vacuum processing system shall be created in such a way that it is able to handle also large-surface substrates with a higher cycle frequency combined with simple handling and a small footprint, so that a high degree of system economy is achieved.

For achieving this objective the vacuum process system features the characteristics according to claim 1. The preferred design versions of the invention are described in the dependant claims.

BRIEF DESCRIPTION OF THE DRAWINGS

One design version of the invention shall be described in more detail based on the enclosed drawing.

DESCRIPTION OF THE PREFERRED EMBODIMENT

Figure 1:
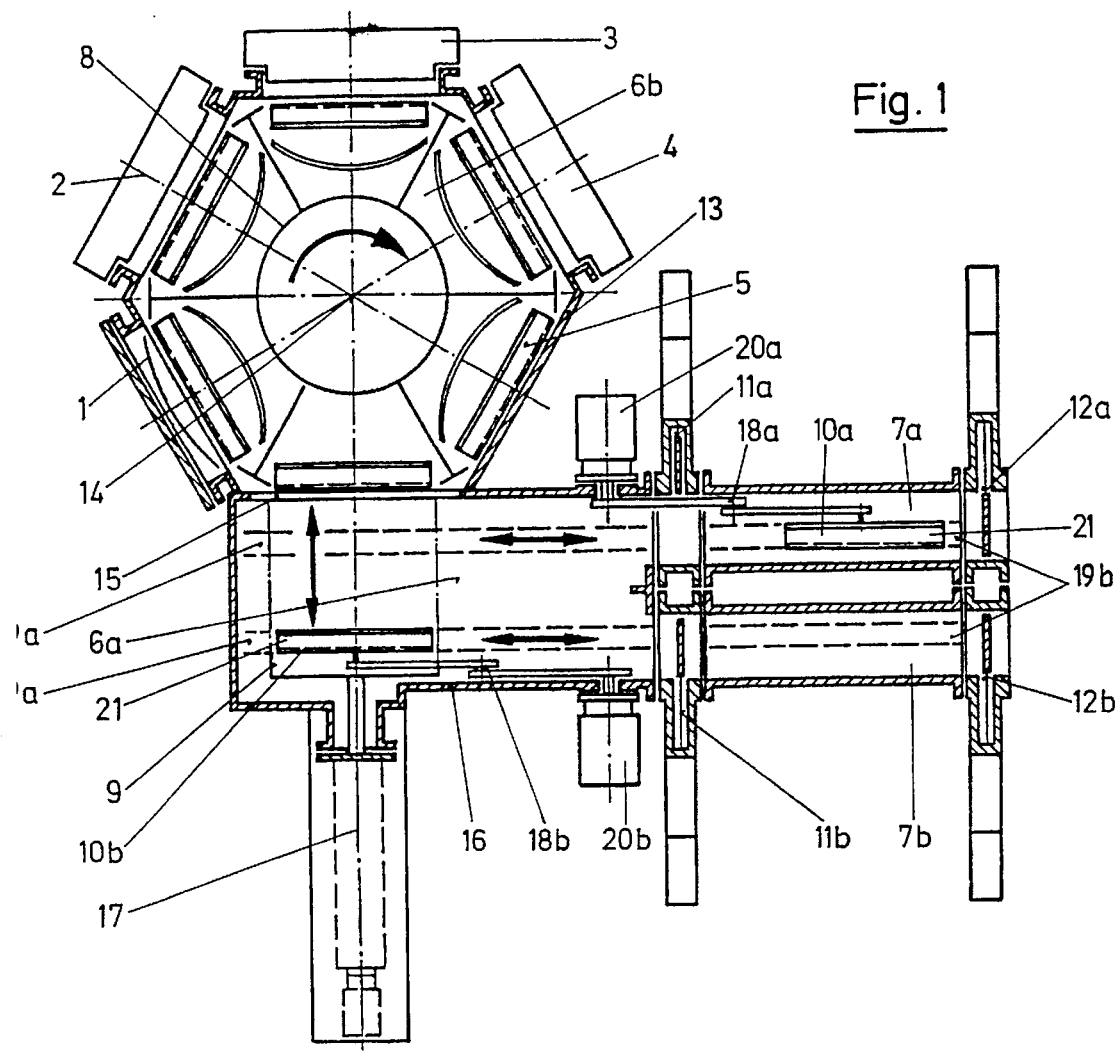
FIG. 1 Schematic view of a horizontal section through the vacuum apparatus.

FIG. 1 is a schematic view of a section through a system conforming to the invention. This system is specifically designed for processing large-surface, plate-shaped workpieces. It is highly suitable for workpieces that are delicate to handle such as thin glass plates for large display panels or monitor screens. The workpieces to be processed are preferably larger than 20 cm in diameter and in particular larger than 40 cm. This system is especially suitable for depositing indium tin oxide (ITO) coatings.

The system consists of a cylindrical or polygonous vacuum chamber arranged around a vertical axis of rotation 14. Said vacuum chamber is designed as a second transfer chamber 6b and features several process stations 1–5 on its shell, arranged around the axis of rotation. For the above mentioned application the process stations are preferably equipped with magnetron sputter sources 2–4, hut also other stations 1, 5 can be used in the conventional manner, such as a plasma etching station or a heating station. The stations can also be designed in such a way that the sources can be mounted to the flange openings on the chamber shell, or installed in the area of the chamber wall. Further, a substrate holder drum 8 is arranged in the chamber around the axis of rotation 14. Said substrate holder 8 which can preferably be rotated in steps around the axis of rotation, is designed in such a way that it can pick up the flat workpieces essentially vertically on the periphery of the drum so that the workpiece surfaces can be positioned at the desired distance directly in front of the corresponding process stations. For the aforementioned application the transfer chamber 6b preferably has a hexagonal or polygonal shape.

On one of the lateral surfaces of the second transfer chamber 6b there is a transfer opening 15 that frees up the entire cross-section so that a flat workpiece can be passed through and deposited on substrate holder drum 8. On the lateral surface of the polygon a first transfer chamber 6a is connected to transfer opening 15. Radially to the axis of rotation 14 and perpendicularly to transfer opening 15 a push rod with drive mechanism 17 is connected to the outside of the first transfer chamber 6a. Said push rod which can be moved into transfer chamber 6a in the aforementioned radial direction is equipped with a gripping device 9 that can pick up the flat workpiece essentially vertically and transport it in this radial direction away from a substrate holder carriage 10a or 10b into the second transfer chamber 6b to substrate holder drum 8.

Tangentially to the second transfer chamber two loading chambers 7a and 7b are arranged, each of which is connected to the first transfer chamber 6a via a loading chamber valve 11a and 11b. In the tangential direction to the second transfer chamber 6b two adjacent linear transport tracks 19 are arranged, each of which can accommodate one substrate holder carriage 10a and 10b respectively, where one track each from the first transfer chamber 6a terminates in one loading chamber 7a or 7b respectively. These two tracks 19 are designed as rails in such a way that a substrate holder carriage 10a or 10b can be moved linearly from loading chamber 7a or 7b into transfer chamber 6a, or in the opposite direction from transfer chamber 6a into loading chambers 7a, 7b. These two parallel running tracks 19 are briefly interrupted between loading chambers 7a, 7b and the first transfer chamber 6a so that the loading chamber valves 11a, 11b can close. The substrate holder carriages 10a, 10b can bridge this interruption during the transport from the loading chamber into the first transfer chamber. Through the said interruption two parallel track pairs 19a and 19b are created. The one pair 19a is located in loading chambers 7a, 7b whereas the second pair is located in transfer chamber 6a.

On the side under atmospheric pressure each of the two loading chambers 7a and 7b feature one loading chamber door 12a and 12b respectively so that the workpieces can be loaded into or unloaded from the system. The handling of the workpieces 21 is strongly simplified by the present arrangement because the loading chambers 7a and 7b are arranged directly parallel in tangential direction to the second transfer chamber 6b and directly adjacent to each other. In front of the loading chamber door 12a, 12b it is, therefore, possible to automate the sequences in a simple manner over short distances by means of additional handling robots. As an additional benefit this concept results in a space-saving, compact design which allows the implementation of short transport paths with few transfer points and with simple handling devices so that not only a higher cycle frequency can be achieved but also the unwanted particle formation is eliminated.

In the present arrangement the workpiece 21 can be deposited on the substrate holder carriage 10a, after which the valves are closed, the pump-down is initiated, the inner loading chamber valve 11a is opened when the proper vacuum is attained, and the transport mechanism 18a, 20a moves into transfer chamber 6a while on the other track a workpiece is transported out of the loading chamber 7b at the same time but in reverse order. Preferably the loading chamber that has just been opened and unloaded should immediately after unloading be reloaded with a workpiece (21) to be processed. In this way very short cycle times can be achieved which are essentially determined by the process time of the individual process stations.

The substrate holders 10a or 10b are preferably moved back and forth linearly by means of a knee type transport joint 18a, 18b by a motor drive 20a, 20b mounted laterally to the outer chamber wall of transfer chamber 6a, about midway of the overall transport path. When the loading chamber valve 11a, 11b is open, the dual lever arm 18 can reach through the valve and push the carriage 10 along rail 19.

Figure 2:
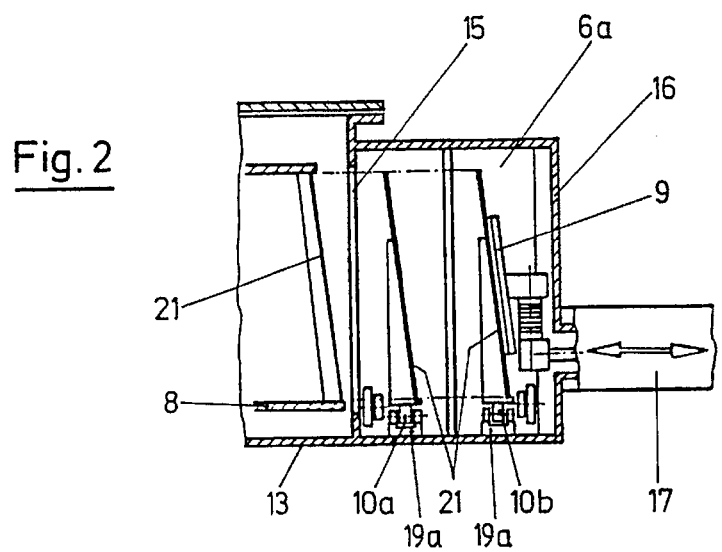
FIG. 2 Schematic view of a section through the transfer chamber a with communication opening to transfer chamber b.

FIG. 2 is a schematic view of a section through the first transfer chamber 6a and the second transfer chamber 6b. The workpieces 21 remain preferably arranged vertically on the substrate holder carriage 10a or 10b. The workpiece holder on the substrate holder carriage 10a, 10b is preferably designed in such a way that the workpieces 21 are simply deposited and remain in place through their own weight. The Workpieces 21 are preferably arranged in a slightly sloping position. Particularly advantageous in this respect is an angle between the plate-shaped workpieces 21 and the vertical direction of less than 10°, but preferably within the range of 4° to 8°. The workpieces 21 essentially remain in the said sloping position throughout the system. Through this arrangement the entire handling of the highly sensitive workpiece plates is strongly simplified. For example, with a simple gripping device 9 and the horizontal push rod movement of the push rod drive the workpiece 21 can be consecutively transported between the substrate holder drum 8 and the substrate holder carriage 10a or 10b by means of a simple lifting and horizontal shifting motion. In this concept no complicated substrate holder for sensitive substrates is required.

For making the operating principle of the system easier to understand, a typical process sequence shall be described as an example:

The workpiece 21 is withdrawn by an external handling system, e.g. a robot system, from a cassette and tilted into the desired sloping position of about 84° relative to the horizontal. In this position the workpiece 21 is located on the momentarily free substrate holder carriage 10a or 10b in the corresponding loading chamber 7a or 7b. Subsequently the corresponding loading chamber door, for example 12a, is closed. The loading chamber 7a is then pumped down and the loading chamber valve 11a is opened. The workpiece 21 positioned on the substrate holder carriage 10a is now transported into the first transfer chamber 6a up to the transfer opening 15. The gripping device 9 picks up the workpiece 21 and the substrate holder carriage 10a returns. Through the radial movement of the gripping device 9 in the direction of the axis of rotation 14 the workpiece 21 is transported through the transfer opening 15 and deposited on the substrate holder drum 8, and this by always maintaining the originally set slope. The substrate holder drum now indexes by one chamber division and transports the workpiece 21 into the first process position for processing. The process position can be designed either as a vacuum-isolated process chamber with valves, or preferably without complete vacuum separation in the conventional manner with shutters and compartmentation. After this step a completely processed substrate is now located in the second transfer chamber 6b in front of transfer opening 15 where it is ready to be withdrawn. Gripping device 9 removes the workpiece 21 from substrate drum 8, and the substrate holder carriage 10a moves into transfer chamber 6a. Gripping device 9 now deposits the workpiece 21 again on the substrate holder carriage 10a. The substrate holder carriage 10a transports the substrate 21 into loading chamber 7a. The loading chamber valve 11a is closed and the loading chamber 7a vented. Loading chamber door 12a is opened so that the workpiece 21 can be removed by the external handling system. At this stage the loading station is ready to accept a new workpiece 21. The procedure starts from the beginning.

For increasing the cycle frequency and for optimally matching it to the concept, two independent loading chambers 7a and 7b in accordance with the invention are used. These are operated in parallel, that is, while one is used by the external handling or undergoing venting or pump-down, the other loading chamber is ready for the internal workpiece exchange. The entire procedure is supervised and time-optimized by an electronic process controller. An apparatus in accordance with this invention is, therefore, an economical production system that is capable of achieving high production performance while fulfilling the sophisticated process requirements for flat panel displays, and it is able to reliably process the necessary substrate panels without breakage.

We claim:

1. Vacuum process system for surface treatment of workpieces (21) comprising:

a vacuum chamber (6b) that envelopes a substrate holder (8) that rotates around a central axis (14) with at least one process station (1–5) arranged around the periphery of said substrate holder, a substrate transfer chamber (6a) that communicates with the vacuum chamber via a transfer opening (15) and which features a first substrate handling and transporting mechanism (9, 17) arranged radially to the central axis (14), at least one loading chamber (7a, 7b) with a loading chamber door (12a, 12b) on the side under atmospheric pressure and a loading chamber valve (11a, 11b) on the side under vacuum for loading or unloading the workpieces (21) for which purpose the loading chamber (7a, 7b) features a second substrate handling and transporting mechanism (10, 18, 19b, 20), characterized by said transfer chamber (6a) being arranged tangentially on the external periphery of the vacuum chamber (6b), being in communication with the latter via a transfer opening (15) so that with the first transporting mechanism (9, 17) workpieces (21) can be fed through the transfer opening (15) for loading the rotatable substrate holder (8) and being further characterized by the loading chamber (7a, 7b) being in communication tangentially to the vacuum chamber (6b) with the transfer chamber (6a) and the transfer chamber (6a) featuring a third transporting mechanism (10, 18, 19a, 20) at a right angle to the first transporting mechanism (9, 17), where the second and third transporting mechanism is arranged in the same tangential direction.

2. Vacuum process system according to claim 1 with at least two adjacent loading chambers (7a) and (7b) arranged on the transfer chamber (6a), with control facilities for selective operation of each lock chamber as a load lock chamber or unload lock chamber.

3. Vacuum process system according to claim 2, with the load or unload lock valves of chamber (7a, 7b) arranged directly adjacent to each other.

4. Vacuum process system according to one of the claim 1 with a second and third transporting mechanism for each loading chamber (7a, 7b) arranged in a tangential line to the vacuum chamber (6b), with the transporting mechanism preferably featuring a track (19a, 19b) for a mobile substrate holder carriage (10a, 10b) and a break in this track between the loading chamber valve (11a, 11b) on the vacuum side.

5. Vacuum process system according to one of the claim 1, where the transfer chamber (6a), arranged radially to the central axis (14) of the system and perpendicularly to the tangential alignment of the transfer and load lock chamber with transporting mechanism, is equipped with a first substrate holder (9, 17) that can be shifted in the radial direction, and with the substrate holder featuring a substrate gripping device (9) for transporting the workpiece (21) between the substrate holder drum (8) and the substrate holder (10a, 10b) in a radial direction.

6. Vacuum process system according to one of the claim 1 with a mobile substrate holder (10a, 10b) in the form of a carriage that can be moved between transfer chamber (6a) and the lock chamber (7a, 7b), preferably with a motor driven dual lever arm (18) arranged on the transfer chamber (6a) so that the arm can reach through the open loading chamber valve (11a, 11b) into the loading chamber (7a, 7b).

7. Vacuum process system according to one of the claim 1, for processing workpieces (21) that are plate shaped and large-surfaced, preferably with a diameter greater than 20 cm, and in particular greater than 40 cm.

8. Vacuum process system according to one of the claim 1 in which system the workpieces (21) are arranged essentially vertically and are preferably resting on the holder (8, 10) having a slope relative to the vertical of less than 10°, preferably within the range of 4° to 8°.

9. Utilization of the vacuum process system according to claim 1 for the surface treatment of glass plates used in the production of flat panel displays.

* * * * *